United States Patent
Donahue

[11] 3,979,697
[45] Sept. 7, 1976

[54] FREQUENCY MODULATED SAW OSCILLATOR

[75] Inventor: Thomas H. Donahue, North Hollywood, Calif.

[73] Assignee: International Telephone and Telegraph Corporation, New York, N.Y.

[22] Filed: Nov. 3, 1975

[21] Appl. No.: 628,082

[52] U.S. Cl. .............................. 331/107 A; 330/5.5; 333/30 R; 333/72
[51] Int. Cl.² ........................................ H03B 5/32
[58] Field of Search ................. 331/107 A; 330/5.5; 333/30 R, 72

[56] References Cited
UNITED STATES PATENTS

| | | | |
|---|---|---|---|
| 3,314,022 | 4/1967 | Meitzler | 331/107 A |
| 3,714,604 | 1/1973 | Kaliski | 333/72 |
| 3,803,520 | 4/1974 | Bristol et al. | 333/30 R |
| 3,894,286 | 7/1975 | Armstrong | 331/107 A |
| 3,946,342 | 3/1976 | Hartmann | 333/30 R |

Primary Examiner—John Kominski
Attorney, Agent, or Firm—William T. O'Neil

[57] ABSTRACT

An oscillator in which the "tank circuit" or feedback element is a surface acoustic wave (SAW) bandpass filter (delay line). A modulating voltage is applied from end-to-end of the piezoelectric substrate material to provide an incremental change of physical length of the substrate as a function of the modulating voltage. Two sets of interleaved fingers along a surface face of the substrate provide an interdigital arrangement for launching (electrical to acoustic transition) and receiving (acoustic to electrical transition) the surface acoustic wave.

10 Claims, 2 Drawing Figures

FREQUENCY MODULATED SAW OSCILLATOR

BACKGROUND OF THE INVENTION

1. Field of the Invention

The invention relates generally to surface acoustic wave (SAW) devices and more specifically, to SAW oscillators.

2. Description of the Prior Art

In the prior art, the so-called SAW devices have found a number of uses. Basically, these devices rely on the generation and detection of surface acoustic waves, also known as RAYLEIGH waves, in a piezoelectric material. Although the piezoelectric phenomenon has been known and used to provide stable signal delay device filters and oscillators, the exploitation of the effect had, until comparatively recently, been largely confined to so-called bulk wave applications.

Relatively recently however, the refinement of photo lighographic processing (photoetch techniques) particularly as applied to micro circuits, has made possible the SAW interdigital transducer. Such devices have been described in the technical and patent literature, for example, in U.S. Pat. application 493,673, filed Aug. 1, 1974, entitled: "Video Processor". That U.S. patent application describes the application of SAW technology to a particular type of video processing and is assigned to the assignee of the present application.

A more directly pertinent prior art document, in that it relates to SAW oscillators specifically, is the technical paper entitled: "The Surface Acoustic Wave Oscillator-A natural and Timely Development of the Quartz Crystal Oscillator", by Meirion Lewis of the Royal Radar Establishment, Malvern, Worcs., UK. That paper was published in the Proceedings of the 28th Annual Symposium on Frequency Control, May 1974, and is distributed by the National Technical Information Service of the U.S. Department of Commerce.

In the aforementioned technical paper, the use of the SAW transducer as the feedback element in an oscillator is shown. The paper also suggests ways of producing frequency control or frequency modulation of the SAW oscillator. The relative difficulty of effecting frequency modulation of such a device can be appreciated as several circuit approaches are suggested by Lewis. These approaches include incorporation of a phase shift network in the amplifier circuit of the oscillator loop, use of varactors in a phase shift network, etc.

Piezoelectric devices, and particularly oscillators employing piezoelectric elements, are noted for their stability, and the same benefits accrue to SAW oscillators of the type to which the present invention applies, as generally applied to bulk effect devices. By bulk effect devices, in this case, it is intended to refer to the crystal oscillator of the type well known and widely used in the radio arts for many decades of time.

It will be realized that the introduction of other circuit elements, such as varactors, etc., must inherently deteriorate the stability advantages enjoyed by unmodulated SAW oscillators, because the frequency determination function is partly usurped from the piezoelectric element. Moreover, the additional complication tends to tarnish the attractiveness of the SAW oscillator, which is inherently a very inexpensive and highly satisfactory device capable of being efficiently manufactured in sizes compatible with micro-circuitry.

The manner in which the present invention provides a unique approach to an arrangement for frequency modulation of a SAW oscillator with very little additional structure, with relatively little impact on inherent stability, and with inherent linearity of oscillator frequency as a function of the applied modulating or controlling signal, will be evident as this description proceeds.

SUMMARY OF THE INVENTION

In accordance with the aforementioned state of the art in connection with SAW devices in general, and in connection with SAW oscillators in particular, it may be said to have been the general objective of the present invention to produce a frequency-modulatable or controllable SAW oscillator which is simple, inexpensive and inherently linear.

Basically, the arrangement of the present invention involves the usual interdigital finger arrangement which may be thought of as first and second electrode sets of conductive material on the surface of a piezoelectric substrate. Separate connections to each of these interleaved finger sets constitute the terminals of the device to which the amplifier of the oscillator circuit is connected in well known fashion, such that the SAW device functions as a delay line (or as a bandpass filter or "tank circuit") for the oscillator, depending upon the language one chooses to use in that connection. The dimension of the piezoelectric substrate running normal to the said fingers is referred to as the length L herein. The piezoelectric substrate has a finite thickness of course, and therefore has end faces at either extremity of the dimension L.

According to the invention, conductive connections are made to those end faces and a signal comprising the modulating voltage is applied across the length dimension of the substrate. In view of the piezoelectric characteristics of the substrate, this applied voltage for frequency modulating or controlling has a corresponding mechanical effect, (i.e., operates to modify the length L of the substrate), thereby changing the frequency of oscillation in accordance with the applied modulating or controlling signal.

Details of an oscillator embodying the present invention will be described hereinafter.

DESCRIPTION OF THE PREFERRED EMBODIMENT

Figure 1:
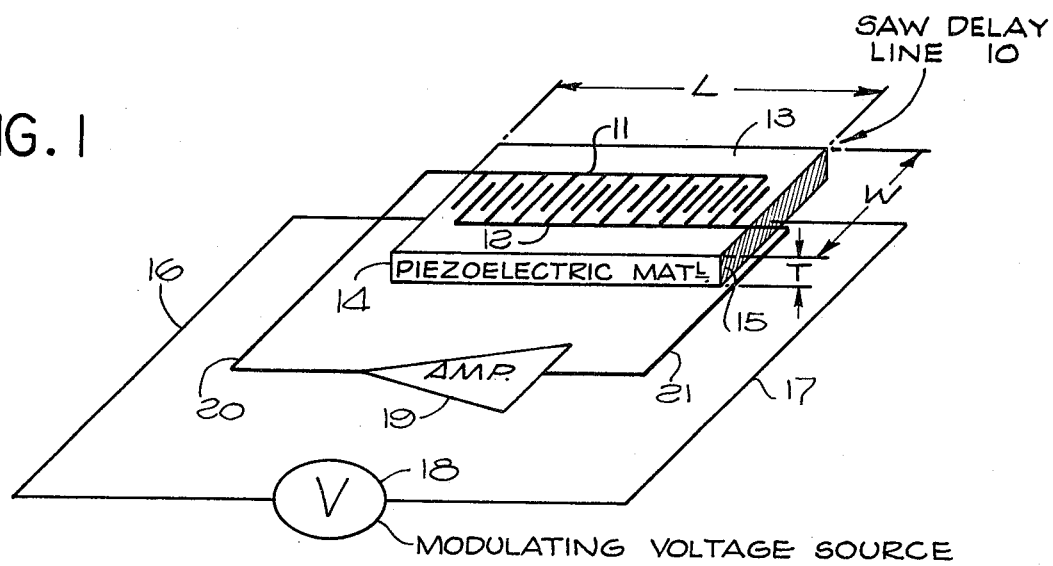
FIG. 1 is a partially pictorial circuit diagram showing the essential elements of an oscillator in accordance with the present invention.

Referring now to FIG. 1, the essentials of the present invention are depicted in schematic and semi-pictorial form.

The oscillator itself comprises the SAW delay line 10 and the amplifier 19. The intedigital fingers are in two sets, 11 and 12, interleaved as indicated.

There are a number of material exhibiting piezoelectric characteristics which can have been used in SAW devices in the prior art. For example, in the device described in the aforementioned U.S. Pat. application 493,673, lithium niobate is used. An embodiment of the present invention was designed for the use of ST or X cut Quartz. The frequency of operation contemplated was on the order of 290 MHz. (bandwidth = 0.5 percent).

From FIG. 1 it will be seen that the amplifier 19 is connected to the SAW delay line 10 which is the frequency determining element of what amounts to a fixed frequency oscillator in the absence of the modulating voltage 18, supplied via leads 20 and 21 to the interdigital finger sets 11 and 12, respectively.

Conductive layers 14 and 15 are emplaced on the crystal substrate end faces as indicated in FIG. 1, and these are connected by leads 16 and 17 to the source of modulating voltage 18. In this way, the piezo-electric material is subjected to a "lengthwise" voltage gradient, and it may be said that there is a secondary reliance on the piezoelectric characteristics of the substrate, in that the modulating voltages applied are applied so as to produce an incremental change in the substrate length L. Since the dimension L is a parameter influencing the frequency of oscillation, the result is frequency modulation or control of the frequency of oscillation as a function of the modulating or controlling potential from 18.

The magnitude of the incremental length change $\Delta L$ follows the equation:

$$\Delta L = \frac{L \, d_{21} \, V}{T}$$

From this equation it is seen that the quiescent length L itself, the piezoelectric coupling coefficient $d_{21}$ in this case, and the applied modulating control voltage V all tend to affect $\Delta L$ according to linear relationships. The thickness T of the substrate appears in the denominator of the equation but is obviously not a variable. Thus it follows that the change of length $\Delta L$ is a linear function of the applied modulating or controlling voltage V and the frequency itself, being proportional to L, is responsive to change ($\Delta L$).

From the foregoing, the change of frequency as a function of applied modulating voltage is a linear function; within a limited range, at least.

The piezoelectric substrate material is a dielectric material in an electrical sense, and accordingly, with appropriate attention to normal voltage handling considerations, the modulating voltage can be quite high to produce a useful frequency excursion as a function thereof.

The so-called piezoelectric coupling coefficient is known to be on the order of $500 \times 10^{-12}$ for a suitably selected quartz material for use in the device of FIG. 1.

Figure 2:
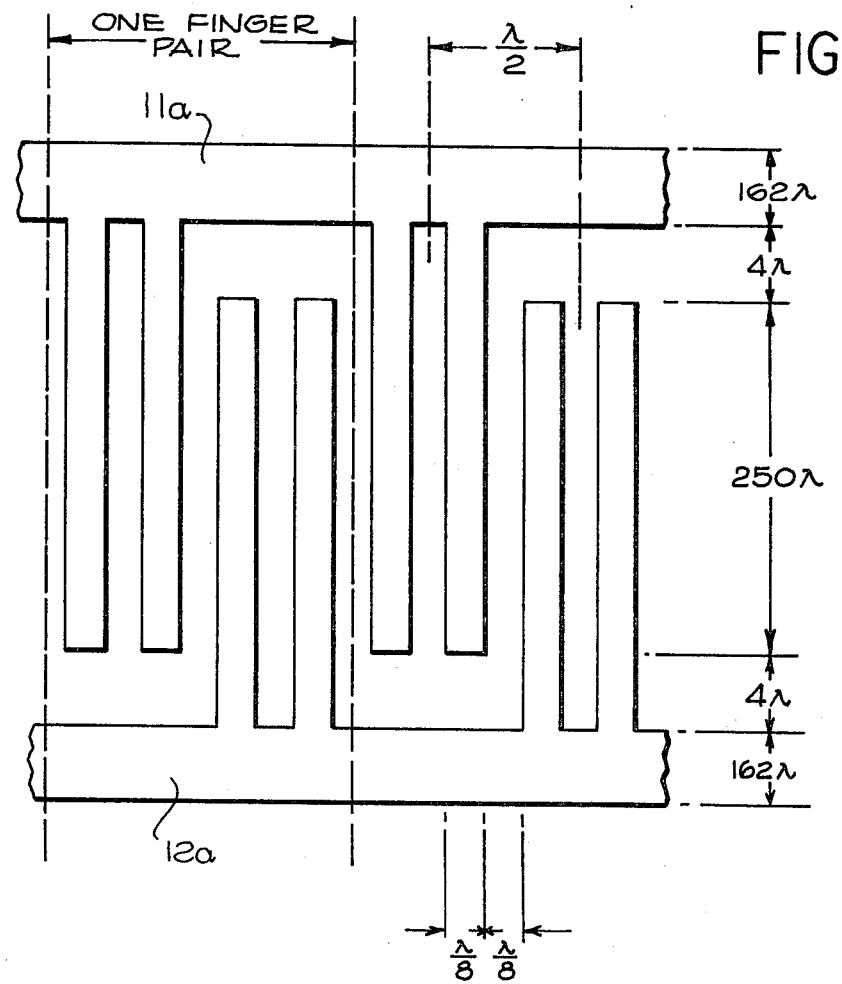
FIG. 2 is an alternative intedigital finger configuration for the device of FIG. 1.

Referring now to FIG. 2, an alternative configuration for the interdigital fingers is depicted. The finger sets 11a and 12a are comparable to those of 11 and 12 in FIG. 1, the difference being that each of the individual fingers has been split into a pair of fingers, as illustrated of FIG. 2. This variation tends to reduce inter-finger reflections by combining reflected waves in phase opposition and therefore may be considered to be a practical improvement over the simpler finger configuration contemplated in FIG. 1.

It will be realized that in both FIG. 1 and FIG. 2, the interdigital fingers are greatly exaggerated for clarity. In FIG. 2, finger widths, lengths and spacing are denoted in terms of fractions or multiples of a wavelengths. For a device operating at the aforementioned 290MHz frequency, the one-eighth wavelength finger width and inter-finger spacing depicted amounts to only 0.05359 + mils. Still further, the $\lambda/2$ dimension indicated at the top of FIG. 2, as well as the $\lambda/8$ dimensions (represented individual finger widths and spacings) are greatly exaggerated in the right-to-left sense on FIG. 2, as is apparent when the finger length dimension of $250\lambda$ to the right of FIG. 2 is noted. Exaggeration of the $4\lambda$ finger base dimension with respect to the aforementioned $250\lambda$ dimension has also been introduced for clarity of illustration.

It is, of course, well understood that devices of this type have only comparatively recently become possible through the application of photolithographic techniques. In the apparatus of the present invention, these known techniques are applicable to the deposition of the interdigital fingers and also to the deposition of the substrate end-face electrodes 14 and 15.

On a lithium niobate sub-structure, aluminum is frequently used as a material photolithographically deposited as interdigital fingers. On a quartz substrate, gold or chrome gold is generally considered more satisfactory. The known technique generally involves steps of vacuum deposition of the material to be used for the fingers, etc: the material being first uniformly deposited, both on the end faces as required by the configuration of FIG. 1, and also on the broad face containing the interdigital finger pattern. A photosensitive chemical is applied and then the substrate surface is exposed to ultraviolet light passing through a mask. The mask allows the ultraviolet to impinge on the chemical material except where it is excluded by the finger pattern to be applied and as contained in the mask itself. Finally an etch bath removes the undesired material (made vulnerable to etching by the photo chemical action), leaving only the finger pattern desired.

In the case of the end electrodes 14 and 15 however, the process is essentially complete once the vacuum deposition is accomplished. To those surfaces, an electical connection is readily provided, for example, by the methods common in the manufacture of monolithic ceramic capacitor chips.

From the foregoing, those skilled in this art will recognize the presentation of a novel and advantageous frequency controllable or modulatable SAW oscillator.

Those skilled in this art will recognize that various modifications in the structure disclosed are possible, once the principles of the invention are understood. Accordingly, it is not intended that the drawings or this description should be intended as limiting the scope of the invention, these being regarded as typical and illustrative only.

What is claimed is:
1. An oscillator comprising:
an amplifier including a positive feedback path;
a surface acoustic wave device including a piezoelectric substrate and two sets of interdigital fingers affixed to said substrate, the circuit between said two finger sets being connected within said feedback path, said device thereby operating as the frequency determining element of said oscillator;
and means for applying an electric field gradient through said substrate substantially parallel to the direction of acoustic wave propagation, thereby to vary the effective length of said substrate and, as a result, the frequency of oscillation.
2. In an oscillator having an amplifier and a surface acoustic wave device connected thereto in a positive feedback path, said device thereby operating as the frequency determining element of said oscillator, the combination comprising:

a generally planar piezoelectric substrate of predetermined thickness;

two sets of interleaved conductive fingers affixed to a planar surface of said substrate, said fingers of each of said sets being electrically interconnected, thereby providing a pair of terminals connected within said feedback path;

means including a conductive surface layer over at least a portion of the pair of opposite substrate end surfaces which are substantially parallel to the fingers of said sets;

and means for applying a modulating voltage between said conductive layers to vary the frequency of operation of said oscillator.

3. Apparatus according to claim 2 in which said conductive surface layers extend over substantially the entire end surfaces which are substantially parallel to the fingers of said set, said end surfaces having said transducer thickness as one dimension thereof.

4. Apparatus according to claim 2 in which said piezoelectric material is one of a group providing a relatively large piezoelectric coupling coefficient.

5. Apparatus according to claim 2 in which said piezoelectric material is quartz.

6. Apparatus according to claim 5 in which said piezoelectric material is ST quartz.

7. Apparatus according to claim 3 in which said conductive surface layers and said interleaved fingers are relatively thin vacuum deposited layers and said fingers photolithographically defined, thereby to provide fingers of dimensions consistent with operation in the UHF region.

8. Apparatus according to claim 7 in which said finger widths and spacings are approximately one-eight wavelength and the length of said fingers is a relatively large number of wavelengths.

9. Apparatus according to claim 1 in which said substrate is generally of rectangular planar surface shape and is of predetermined thickness, said means for applying an electric field comprising a pair of conductive surfaces along opposite end faces of said substrate, said surfaces covering substantially said end faces, one dimension of said conductive surfaces being said predetermined thickness.

10. Apparatus according to claim 9 in which said piezoelectric substrate material is quartz.

* * * * *